United States Patent
Teng

(10) Patent No.: US 8,087,355 B2
(45) Date of Patent: *Jan. 3, 2012

(54) METHOD OF TREATING ON-PRESS DEVELOPABLE LITHOGRAPHIC PRINTING PLATE

(76) Inventor: Gary Ganghui Teng, Northborough, MA (US)

( * ) Notice: Subject to any disclaimer, the term of this patent is extended or adjusted under 35 U.S.C. 154(b) by 507 days.

This patent is subject to a terminal disclaimer.

(21) Appl. No.: 11/825,576

(22) Filed: Jul. 6, 2007

(65) Prior Publication Data

US 2007/0254241 A1 Nov. 1, 2007

Related U.S. Application Data

(63) Continuation-in-part of application No. 11/787,878, filed on Apr. 17, 2007, now Pat. No. 7,752,966, which is a continuation-in-part of application No. 11/266,817, filed on Nov. 4, 2005, now Pat. No. 7,213,516.

(51) Int. Cl.
*B41M 5/00* (2006.01)
(52) U.S. Cl. .................. 101/463.1; 101/401.1
(58) Field of Classification Search ............... 101/463.1, 101/401.1
See application file for complete search history.

(56) References Cited

U.S. PATENT DOCUMENTS

| | | | |
|---|---|---|---|
| 4,762,772 A * | 8/1988 | Kobayashi et al. ........... 430/309 |
| 5,607,816 A | 3/1997 | Fitzgerald et al. ......... 430/271.1 |
| 5,910,395 A | 6/1999 | Li et al. .......................... 430/302 |
| 6,014,929 A | 1/2000 | Teng ............................ 101/456 |
| 6,136,503 A | 10/2000 | Zheng et al. ............... 430/270.1 |
| 6,153,356 A | 11/2000 | Urano et al. .............. 430/281.1 |
| 6,232,038 B1 | 5/2001 | Takasaki et al. ........... 430/281.1 |
| 6,309,792 B1 | 10/2001 | Hauck et al. ................ 430/270.1 |
| 6,331,375 B1 | 12/2001 | Kawamura et al. ......... 430/270.1 |
| 6,410,208 B1 * | 6/2002 | Teng ............................ 430/302 |
| 6,482,571 B1 | 11/2002 | Teng ............................ 430/302 |
| 6,543,348 B2 * | 4/2003 | Onuma et al. ............... 101/142 |
| 6,576,401 B2 | 6/2003 | Teng ............................ 430/303 |
| 6,689,537 B2 | 2/2004 | Urano et al. ............... 430/273.1 |
| 6,740,464 B2 | 5/2004 | Maemoto ..................... 430/138 |
| 6,881,532 B2 | 4/2005 | Suzuki ......................... 430/302 |
| 2003/0010240 A1 * | 1/2003 | Verschueren et al. ...... 101/450.1 |
| 2003/0186165 A1 | 10/2003 | Gries et al. ................. 430/281.1 |
| 2005/0196164 A1 * | 9/2005 | Sasayama ..................... 396/571 |
| 2005/0271981 A1 * | 12/2005 | Oohashi et al. ............... 430/300 |
| 2008/0280234 A1 * | 11/2008 | Teng ............................ 430/325 |

* cited by examiner

*Primary Examiner* — Judy Nguyen
*Assistant Examiner* — Shema Freeman

(57) ABSTRACT

A method of treating an on-press developable lithographic printing plate with a treating solution after imagewise exposure and before on-press development is described. The plate comprises on a substrate a photosensitive layer developable with ink and/or fountain solution and capable of hardening upon exposure to a radiation. The plate is imagewise exposed with a radiation, overall treated with a treating solution to cause at least one chemical or physical change in the photosensitive layer or on the substrate surface, and then on-press developed with ink and/or fountain solution. Such a treatment allows improvement on the performance of the imagewise exposed plate by, for example, improving the white light stability, forming visible imaging, increasing the hydrophilicity of the substrate, or increasing the developability of the photosensitive layer.

11 Claims, No Drawings

METHOD OF TREATING ON-PRESS DEVELOPABLE LITHOGRAPHIC PRINTING PLATE

RELATED PATENT APPLICATIONS

This application is a continuation-in-part application of U.S. patent application Ser. No. 11/787,878 filed Apr. 17, 2007 now U.S. Pat. No. 7,752,966 that is a continuation-in-part application of U.S. patent application Ser. No. 11/266,817 filed Nov. 4, 2005, now U.S. Pat. No. 7,213,516.

FIELD OF THE INVENTION

This invention relates to lithographic printing plate. More particularly, it relates to a method of treating a lithographic plate after imagewise exposure and before on-press development.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate.

Traditionally, the plate is exposed with an ultraviolet light from a lamp through a separate photomask film having predetermined imaging pattern that is placed between the light source and the plate. Laser sources have been increasingly used to imagewise expose a printing plate that is sensitized to a corresponding laser wavelength, allowing the elimination of the photomask film. Suitable lasers include, for example, infrared lasers (such as laser diode of about 830 nm and NdYAG laser of about 1064 nm), visible lasers (such as frequency-doubled NdYAG laser of about 532 nm and violet laser diode of about 405 nm), and ultraviolet laser (such as ultraviolet laser diode of about 370 nm). Laser sensitive plates generally have higher sensitivity (than conventional plates) because of the limited power of current laser imagers.

Conventionally, the exposed plate is developed with a liquid developer to bare the substrate in the non-hardened or solubilized areas. On-press developable lithographic printing plates have been disclosed in recent years. Such plates can be directly mounted on press after imagewise exposure to develop with ink and/or fountain solution during the initial prints and then to print out regular printed sheets. No separate development process before mounting on press is needed, allowing the reduction of labor and the elimination of hazardous waste. Among the patents describing on-press developable lithographic printing plates are U.S. Pat. Nos. 5,258,263, 5,516,620, 5,561,029, 5,616,449, 5,677,110, 5,811,220, 6,014,929, 6,071,675, and 6,482,571.

While on-press developable plates have the advantage of not requiring a separate wet development process, such plates often have the drawbacks of limited room light stability and weaker visible images. Also, it is hard to design a plate with combined good on-press developability, clean background and good resolution, because, for example, the factors which favor on-press developability or clean background often offset the small dots resolution. It would be desirable if the above drawbacks or problems could be eliminated.

The inventor has found that a simple treatment method can be used for the exposed plate to cause certain chemical or physical change to the plate without developing the plate, so as to eliminate the above drawbacks or enhance the performance of the plate, still without requiring a tedious separate development process.

SUMMARY OF THE INVENTION

According to the present invention, there has been provided a method of lithographically printing images on a receiving medium, comprising in order:

(a) providing a lithographic plate comprising (i) a substrate, and (ii) a photosensitive layer; said photosensitive layer being soluble or dispersible in ink and/or fountain solution and capable of hardening upon exposure to a radiation having a wavelength selected from 200 to 1200 mm;

(b) imagewise exposing said plate with said radiation to cause hardening of said photosensitive layer in the exposed areas, so as to form hardened areas in the exposed areas and non-hardened areas in the non-exposed areas;

(c) treating said exposed plate with a treating solution to cause at least one chemical or physical change in the photosensitive layer or on the substrate surface;

(d) optionally, drying said treated plate to remove at least some of the water or solvent from the treating solution;

(e) developing said dried plate with ink and/or fountain solution on a lithographic press to remove the photosensitive layer in the non-hardened areas; and (f) lithographically printing images from said plate to the receiving medium.

The above treated plate is preferably dried in said step (d) to remove at least some of the water or solvent from the treating solution so that the dried plate is at least free of overflowing liquid on the surface; more preferably said dried plate is at least free of wet-looking liquid layer on the surface; most preferably said dried plate is substantially free of the water applied with the treating solution. Here, the term "overflowing liquid" means the liquid on the surface of the plate which is capable of dripping off if the plate is titled. The term "wet-looking liquid" layer means the thin layer of liquid on the plate surface which makes the plate look wet; the plate will look dry once such wet-looking liquid layer is removed or dried off. The treated plate is preferably dried by a mechanical liquid-removal device (such as squeegee rollers or a rubber blade), forced air, and/or heat; more preferably by squeegee rollers, forced air, and/or heat; and most preferably by squeegee rollers followed by forced hot air.

Said treating solution is capable of causing a chemical or physical change in the photosensitive layer or on the substrate surface (coated side). Preferably, the treating solution is capable of causing a chemical change in the photosensitive layer or on the substrate surface. Here the term chemical change means a chemical reaction, including a reaction between acid and base.

The treating solution is preferably capable of diffusing into the non-hardened areas of the photosensitive layer more efficiently than into the hardened areas of the photosensitive layer (diffusing more or only into the non-hardened areas, with less or no diffusion into the hardened areas), so that the solution causes chemical or physical change primarily or only in the non-hardened areas (with less or no effect in the hardened areas).

The treating solution can be a deactivating solution capable of deactivating the photosensitive layer (at least in the non-hardened areas), a discoloring solution capable of changing the color of the photosensitive layer primarily or only in the non-hardened areas (with less or no color change in the hardened areas), a hydrophilizing solution capable of enhancing the hydrophilicity of the substrate, a development enhancing solution capable of increasing the ease of on-press development with ink and fountain solution, or a solution capable of causing a chemical or physical change to the photosensitive layer or the substrate for other performance enhancement. Preferably, the treating solution comprises a deactivating agent, a discoloring agent, a hydrophilizing agent, or a development enhancer in water and/or organic solvent.

The radiation for imagewise exposure in this application can be any radiation having a wavelength selected from 200 to 1200 nm which is capable of causing hardening to the photosensitive layer. Such radiation is preferably a laser, more preferably a violet or ultraviolet laser (200 to 430 nm) or an infrared laser (750 to 1200 nm), most preferably a violet or ultraviolet laser.

DETAILED DESCRIPTION OF THE PREFERRED EMBODIMENTS

The treating solution can be any solution capable of causing a chemical or physical change (preferably a chemical change) to the photosensitive layer or to the substrate surface. Preferably, such a treating solution is a deactivating solution capable of deactivating the photosensitive layer, a discoloring solution capable of changing the color of the photosensitive layer primarily or only in the non-hardened areas, a hydrophilizing solution capable of enhancing the hydrophilicity of the substrate, a development enhancing solution capable of increasing the on-press developability with ink and/or fountain solution. More preferably, the treating solution is a solution comprising a deactivating agent, a discoloring agent, a hydrophilizing agent, or a development enhancer. Most preferably, the treating solution is an aqueous solution comprising a deactivating agent, a discoloring agent, a hydrophilizing agent, or a development enhancer.

The treating solution can be based on water and/or organic solvent as the solvent. Preferably, the treating solution is an aqueous solution. More preferably, the treating solution is an aqueous solution comprising at least 50% by weight of water, most preferably at least 80% by weight of water.

The deactivating agent can be any material that can deactivate the photo hardening capability of the photosensitive layer in the non-hardened areas, so that the non-hardened photosensitive layer (which is originally capable of hardening under a room light) becomes incapable or having reduced rate (preferably incapable) of hardening under such room light. The deactivating agent can be a solid, liquid, or gas; preferably a liquid or solid. Either organic or inorganic compound can be used as deactivating agent, such as organic or inorganic acid, base, oxidizer, reducer, or inhibitor. Various deactivating agents have been described in U.S. Pat. No. 7,213,516, and U.S. patent application Ser. Nos. 11/356,911, 11/728,648, 11/787,878, and 11/800,634; the entire disclosures of which are hereby incorporated by reference. The deactivating agent is preferably soluble in water or an organic solvent to form a deactivating solution. More preferably, the deactivating agent is soluble in water and is applied from an aqueous solution. A water-soluble organic solvent, such as ethylene glycol, can be added into the aqueous solution. Certain additives, such as dye, dispersed pigment, bactericide, stabilizer, reducer, thickening agent, and surfactant, can be added. The concentration of the deactivating agent in a deactivating solution is from 0.01 to 70%, more preferably from 0.1 to 30%, and most preferably from 1 to 10% by weight of the solution.

For free radical polymerizable photosensitive layer, the deactivating agent can be a compound that can react with a component of the free radical initiating system (such as initiator, sensitizing dye, hydrogen donor, or monomer; preferably the initiator, sensitizing dye, or hydrogen donor). For cationic polymerizable photosensitive layer, the deactivating agent can be a compound that can react with a component of the cationic polymerization system (such as the initiator which is an acid generator, sensitizing dye, or monomer; preferably the initiator or sensitizing dye).

For polymerizable photosensitive layer having an amine group or other acid-reacting group (a group capable of reacting with an acid) in the initiator, sensitizing dye, or hydrogen donor, an acid compound (including organic acid and inorganic acid) can be used as the deactivating agent. Suitable organic acids include, for example, organic compounds having at lease one carboxylic acid group, a sulfonic acid group, or phosphonic acid group. Suitable inorganic acids include, for example, phosphoric acid, boric acid, and hydrochloride acid. Preferred acids are those with moderate acidity, such as organic compounds with at least one carboxylic acid group, phosphoric acid, polyvinyl phosphonic acid, and boric acid. More preferred are water soluble organic acids. Most preferred are water-soluble organic compounds having at least one carboxylic acid group. Suitable organic acids include, for example, citric acid, acetic acid, salicylic acid, glycolic acid, malic acid, and lactic acid. Citric acid and malic acid are particularly suitable because they are widely used natural organic acids and are non-hazardous to the environment. The acid is preferably applied as an aqueous solution to deactivate the photosensitive layer. When strong acid (such as hydrochloric acid) is used as deactivating agent, it is preferably diluted to low concentration (such as less than 0.5%, preferably less than 0.1% by weight) in an aqueous solution to apply to the plate so that it does not damage the plate or cause safety problem. The acidic deactivating solution preferably has a pH of from 0.1 to 6.5, more preferably from 0.5 to 5.0, and most preferably from 1.0 to 4.0. The acidic deactivating solution preferably has a concentration of from 0.01 to 70%, and more preferably from 0.05 to 30% by weight of the solution. The aqueous acidic deactivating solution based on organic acid preferably has a concentration of from 0.1 to 70%, more preferably from 0.5 to 30%, and most preferably from 2 to 10% by weight of the solution.

An alkaline compound can also be used as the deactivating agent for certain negative plates with free radical or cationic polymerizable or other acid crosslinkable photosensitive layers because it can react with certain free radical initiating system (such as initiator, sensitizing dye, or hydrogen donor), certain cationic initiating system (such as initiator which is an acid generator, or sensitizing dye), and other acid crosslinkable systems (such as negative-working diazonaphthoquinone systems). For example, an alkaline compound can react with an ionic initiator such as an onium salt, an ionic sensitizing dye such as a cyanine dye, or a hydrogen donor having carboxylic acid or thiol group; and can also neutralize with a cationic initiator which is an acid generator. Suitable alkaline compounds include, for example, sodium silicate, potassium silicate, sodium carbonate, sodium hydroxide, and organic amines. Preferred alkaline compounds are water-soluble compounds with moderate basicity, such as sodium silicate, potassium silicate, ammonium hydroxide, and amines. More preferred amines are organic amines, including polymeric amines. Suitable water-soluble amines include regular amine compounds such as triethylamine, triethanolamine, 2-amino-2-methyl-1-propanol, tris(hydroxymethyl) aminomethane and N-methyl-2-pyrrolidone, and polymeric amines such as polyethyleneamine. The alkaline compound is preferably applied as an aqueous solution to deactivate the photosensitive layer. When strong base (such as sodium hydroxide) is used as deactivating agent, it is preferably diluted to low concentration (such as less than 0.5%, preferably less than 0.1% by weight) in an aqueous solution so that it does not damage the plate or cause safety problem. The alkaline deactivating solution preferably has a pH of from 7.5 to 13.5, more preferably from 8.0 to 12.0, and most preferably from 9.0 to 11.0. The alkaline deactivating solution preferably has a concentration of from 0.01 to 70%, and more preferably from 0.05 to 30% by weight of the solution. The aqueous alkaline deactivating solution based on organic amine preferably has a concentration of from 0.1 to 70%, more preferably from 0.5 to 30%, and most preferably from 2 to 10% by weight of the solution.

A free radical inhibitor can be used as the deactivating agent for plates with a free radical polymerizable photosensitive layer. Examples of suitable free radical inhibitors include methoxyhydroquinone, hydroquinone, 2,6-di-tert-butyl-4-methylphenol, polyvinylphenol, other compounds with at least one phenol group, and various commercial free radical stabilizer. Preferably, the inhibitor is dissolved in water or a water-solvent mixture (containing water and a water soluble organic solvent) to form an aqueous deactivating solution for applying to the plate. The deactivating solution based on a free radical inhibitor preferably has a concentration of from 0.1 to 70%, more preferably from 0.5 to 30%, and most preferably from 2 to 10% by weight of the solution.

The discoloring agent suitable for this invention can be any material that is capable of changing the color of the photosensitive layer primarily or only in the non-hardened areas, with less or no color change in the hardened areas. Preferably, the discoloring agent suitable for this invention is a material that is capable of reacting with a dye or latent dye in the photosensitive layer to cause color change (including turning on or turning off of color). The discoloring agent is preferably dissolved in water and/or an organic solvent to form a discoloring solution. It is preferably soluble in water and is dissolved in water to form an aqueous discoloring solution. The discoloring agent can be a solid, liquid, or gas; preferably a liquid or solid. Various additives, such as surfactant, stabilizer, bactericide, defoamer, dye, cosolvent, pigment, and thickener can be added in the discoloring solution. Depending on the photosensitive layer as well as its dye or pigment system, the discoloring agent can be different.

The discoloring solution is capable of diffusing into the non-hardened areas more efficiently than into the hardened areas, the application of such discoloring solution causes color change primarily or only in the non-hardened areas, with less or no color change in the hardened areas. Here, the term "the discoloring solution is capable of diffusing into the non-hardened areas of the photosensitive layer more efficiently than into the hardened areas" means that more discoloring solution can diffuse into the non-hardened areas of the photosensitive layer while less or no discoloring solution can diffuse into the hardened areas of the photosensitive layer.

For photosensitive layer comprising a visible dye capable of discoloration, the discoloring agent can be any compound capable of discoloring the dye. The application of the discoloring agent from a discoloring solution changes the color of the dye primarily or only in the non-hardened areas, with less or no color change in the hardened areas. Preferably, the color change is color reduction. For example, an imagewise exposed photosensitive layer comprising a crystal violet can be discolored with a hydrochloric acid aqueous solution to reduce the blue color in the non-exposed areas, with the hardened areas remaining substantially the original blue color.

For photosensitive layer comprising a latent dye, the discoloring agent can be any compound capable of turning on the color of the latent dye. The application of said discoloring agent from a discoloring solution partially or completely turns on the color of the latent dye primarily or only in the non-hardened areas, with less or no color change in the hardened areas. Examples of such system include a photosensitive layer having an acid sensitive latent dye and a discoloring agent which is an acid aqueous solution, and the application of such acid solution to the imagewise exposed plate turns on the color primarily or only in the non-hardened areas, with less or no color turning on in the hardened areas. Various latent dyes can be used, such as leuco crystal violet, leucomalachite green, azobenzene, 4-phenylazodiphenylamine, and methylene blue dyes.

For photosensitive layer having a visible dye capable of changing color (preferably turning off color) or a latent dye capable of turning on color upon contact with an acid, an acid solution can be used as the discoloring solution. Preferably, an acid aqueous solution is used as the discoloring solution. The acid can be an organic acid or inorganic acid. Suitable organic acids include, for example, organic compounds having at lease one carboxylic acid group, a sulfonic acid group, or phosphonic acid group. Suitable inorganic acids include, for example, phosphoric acid, boric acid, and hydrochloride acid. Preferred acids are those with moderate acidity, such as organic compounds with at least one carboxylic acid group, phosphoric acid, polyvinyl phosphonic acid, and boric acid. More preferred are water soluble organic acids. Most preferred are water-soluble organic compounds having at least one carboxylic acid group. Solid acid (such as citric acid) is particular useful because it does not evaporate from the photosensitive layer. Suitable organic acids include, for example, citric acid, acetic acid, salicylic acid, glycolic acid, malic acid, and lactic acid. Citric acid and malic acid are particularly suitable because they are widely used natural organic acids and are non-hazardous to the environment. The acid is preferably applied as an aqueous solution to discolor the photosensitive layer. When strong acid (such as hydrochloric acid) is used as discoloring agent, it is preferably diluted to low concentration (such as less than 0.5%, preferably less than 0.1% by weight) in an aqueous solution to apply to the plate so that it does not damage the plate or cause safety problem. The acidic discoloring solution preferably has a pH of from 0.1 to 6, more preferably from 0.5 to 4.0, and most preferably from 1.0 to 3.0. The acidic discoloring solution preferably has a concentration of from 0.01 to 70%, and more preferably from 0.05 to 30% by weight of the solution. The aqueous acidic discoloring solution based on organic acid preferably has a concentration of from 0.1 to 70%, more preferably from 0.5 to 30%, and most preferably from 2 to 10% by weight of the solution.

For photosensitive layer having a visible dye capable of changing color (preferably turning off color) or a latent dye capable of turning on color upon contact with a base, an alkaline solution can be used as the discoloring solution. Preferably, an alkaline aqueous solution is used as the discoloring solution. Suitable alkaline compounds include, for example, sodium silicate, potassium silicate, sodium carbonate, sodium hydroxide, and organic amines. Preferred alkaline compounds are water-soluble compounds with moderate basicity, such as sodium silicate, potassium silicate, ammonium hydroxide, and amines. More preferred amines are organic amines, including polymeric amines. Suitable water-soluble amines include regular amine compounds such as triethylamine, triethanolamine, 2-amino-2-methyl-1-propanol, tris(hydroxymethyl)aminomethane and N-methyl-2-pyrrolidone, and polymeric amines such as polyethyleneamine. The alkaline compound is preferably applied as an aqueous solution to discolor the photosensitive layer. When strong base (such as sodium hydroxide) is used as discoloring agent, it is preferably diluted to low concentration (such as less than 0.5%, preferably less than 0.1% by weight) in an aqueous solution so that it does not damage the plate or cause safety problem. The alkaline discoloring solution preferably has a pH of from 8 to 13.5, more preferably from 8.5 to 12.0, and most preferably from 9.0 to 11.0. The alkaline discoloring solution preferably has a concentration of from 0.01 to 70%, and more preferably from 0.05 to 30% by weight of the solution. The aqueous alkaline discoloring solution based on organic amine preferably has a concentration of from 0.1 to 70%, more preferably from 0.5 to 30%, and most preferably from 2 to 10% by weight of the solution.

For a photosensitive layer comprising a dispersed pigment, the discoloring solution can be any material capable of causing flocculation of the dispersed pigment primarily or only in the non-hardened areas. Such a discoloring solution is also called flocculating solution. Here the term flocculation means becoming non-dispersed, aggregated, or insolubilized from a dispersed or solubilized system. Preferably, the flocculating solution is a solution (including blend of solvents, with water also being considered a solvent) capable of causing flocculation (or aggregation) of the dispersed pigment in the photosensitive layer upon diffusing into it and capable of diffusing into the non-hardened areas of the photosensitive layer more efficiently than into the hardened areas. More preferably, the flocculating solution diffuses into the photosensitive layer in the non-hardened areas to flocculate the pigment without completely dissolving the photosensitive layer so that the photosensitive layer in the non-hardened areas does not flow around. Any pigment can be used, including organic pigment such as copper phthalocyanine and other phthalocyanine pigments, and inorganic pigment such as iron oxide and copper carbonate. The pigment is dispersed as fine particles in the photosensitive layer, usually with certain pigment dispersant or polymer, so as to have good color strength. The flocculating solution is preferably capable of swelling (without completely dissolving) the photosensitive layer in the non-hardened areas but incompatible with (causing flocculation of) the pigment dispersion. A compound capable of causing or helping the flocculation (such as by physical interaction or chemical reaction with the dispersant) can be used in the flocculating solution.

For a photosensitive layer comprising a visible dye capable of flocculation, the discoloring solution (also called flocculating solution here) can be any solution capable of causing flocculation of such dye primarily or only in the non-hardened areas. The visible dye is insoluble in the non-hardened photosensitive layer soaked with such flocculating solution and is capable of flocculating into less or different colored (preferably less colored) aggregates in the photosensitive layer. Preferably, the flocculating solution is capable of causing flocculation of the visible dye in the photosensitive layer upon diffusing into it and capable of diffusing into the non-hardened areas of the photosensitive layer more efficiently than into the hardened areas. More preferably, the flocculating solution is capable of diffusing into the photosensitive layer in the non-hardened areas without completely dissolving the photosensitive layer so that the photosensitive layer in the non-hardened areas does not flow around.

The hydrophilizing agent can be any compound capable of enhancing the hydrophilicity of the substrate. Preferably, such hydrophilizing agent is an acid or base, more preferably an acid. Suitable acid compounds include organic compounds with at least 1 carboxylic acid groups, polymers with phosphonic acid groups, and phosphoric acid. Particularly suitable acid compounds include citric acid, acetic acid, salicylic acid, glycolic acid, malic acid, lactic acid, phosphoric acid, and polyvinyl phosphonic acid. The hydrophilizing agent is preferably dissolved in water and/or an organic solvent, more preferably in water, to form a hydrophilizing solution for applying to the plate.

The development enhancer can be any compound capable of enhancing the developability of the photosensitive layer in ink and/or fountain solution. Preferably, such development enhancer is an organic compound capable of enhancing the developability of the photosensitive layer in ink and/or fountain solution. More preferably, such development enhancer is a liquid organic compound capable softening the photosensitive layer. The water soluble liquid organic compound suitable as development enhancer preferably has a boiling point of at least 150° C., more preferably at least 200° C., and most preferably at least 250° C. Suitable development enhancers include, for example, polyethylene glycol, glycerin, methoxypropanol, diethyleneglycol, triethyleneglycol, and various nonionic surfactants. The development enhancer is preferably dissolved in water and/or an organic solvent, more preferably in water, to form a development enhancing solution for applying to the plate. Preferably, the application of the development enhancer increases the ease of developing the plate, so that the roll up impressions (the number of rotations of the plate cylinder between engaging the inking roller and completely cleaning up the background of the plate) is reduced by at least 5 impressions, more preferably at least 10 impressions, and most preferably at least 20 impressions due to the application of the development enhancer. For example, for an untreated plate originally requiring 30 roll up impressions (of the rotations of the plate cylinder) to achieve clean background, the same plate treated with a development enhancer only requires at most 25 roll up impressions (preferably at most 20 impressions, more preferably at most 10 impressions) to achieve clean background.

The treating solution should be capable of enhancing a certain aspect of the performance of the plate. Preferably, the treating solution is capable of enhancing more than one aspects of the performance of the imagewise exposed plate, such as enhancing both the white light stability (by deactivating the photosensitive layer) and the visible image contrast (by discoloration primarily or only in the non-hardened areas). More preferably, the treating solution is capable of enhancing the white light stability (by deactivation), the image contrast (by discoloration primarily or only in the non-hardened areas), the hydrophilicity of the substrate, and the developability of the photosensitive layer. The treating solution capable of two or more functions (such as both deactivation and discoloration) can comprise 2 separate components (such as a deactivating agent and a discoloring agent), can comprise the same component capable of both functions (such as a deactivating agent which is also a discoloring agent), or can comprise both a component with two or more functions and a component with only single function. Preferably, the treating solution comprises at least one component which is capable of two or more functions (such as both deactivating the photosensitive layer and hydrophilizating the substrate). Examples of multifunctional treating agents include an acid compound (such as citric acid, applied from an aqueous solution) which is capable of deactivation, discoloration, and hydrophilization for certain plates. Examples of single-functional treating agents include a water soluble organic solvent (such as triethyleneglycol, applied from an aqueous solution) which is capable of enhancing the on-press developability of the photosensitive layer.

The treating solution can be applied to the photosensitive layer of the plate through any means, such as spray, dipping, roller coating, slot coating, etc. The treating solution can be at room temperature or an elevated temperature, preferably room temperature.

The treated plate is preferably further dried to remove at least some of the water or solvent from the treating solution (which has been applied to the plate). More preferably the plate is dried so that the plate surface is at least free of overflowing liquid. Most preferably, the plate is dried so that the plate surface is at least free of wet-looking liquid layer. The treated plate can be dried by any means, such as squeegee rollers, forced air, heat, or rubber blade. Preferably, the treated plate is dried with squeegee rollers, forced hot air, or squeegee rollers followed by forced air. More preferably, the treated plate is dried by a pair of squeegee rollers followed by forced hot air.

The treating solution is preferably applied to the imagewise exposed plate on a treating device. Preferably, the plate is transported through the treating device to contact with the treating solution. The treating device preferably further comprises a drying unit (such as a pair of squeegee rollers, forced air, heater, or a pair of squeegee rollers followed by forced hot air) to dry off the liquid on the plate surface. The treating device can be a separate device from the exposure device, or can be connected to or be part of the exposure device. Preferably, the treating device is connected to or is part of the exposure device.

For plate with an overcoat, the treating solution can be applied with or without the overcoat being removed first (such as by rinsing with water or an aqueous solution). When the overcoat is not removed before applying the treating solution, the treating solution may penetrate through the overcoat without removing the overcoat, or partially or completely remove the overcoat.

The treated plate may be further overall exposed with a second radiation to, for example, further enhance the visible image or give a different-colored visible image and/or to cause further crosslinking of the photosensitive layer in the hardened areas, without causing hardening of the non-hardened areas, before on-press development. Preferably the treating solution is capable of deactivating the hardening capability of the photosensitive layer in the non-hardened areas. The radiation for the overall exposure can be applied with any exposure method which delivers radiation to the whole photosensitive layer; preferably from a lamp on an exposure device, on a treating device (by passing through it), or under room light; more preferably on an exposure device or by passing through a radiation from a lamp on a treating device; most preferably by passing through a radiation from a lamp on a treating device.

The treated plate may be further overall heated to, for example, further enhance the visible image or give a different-colored visible image and/or to cause further crosslinking of the hardened areas of the photosensitive layer, before on-press development. The heating can be applied through any means, such as hot plate, oven, passing-through heater, radiation heater, and hot air heater. Preferably, the plate is passed through a heater having radiation or hot air. More preferably, the plate is passed through a heater which is part of or connected to a treating device.

The substrate employed in the lithographic plates of this invention can be any lithographic support. Such a substrate may be a metal sheet, a polymer film, or a coated paper. Aluminum (including aluminum alloy) sheet is a preferred metal support. Particularly preferred is an aluminum support that has been grained and anodized (with or without deposition of a barrier layer). Polyester film is a preferred polymeric film support. A surface coating may be coated to achieve desired surface properties. For wet plate, the substrate should have a hydrophilic or oleophilic surface, depending on the surface properties of the photosensitive layer (preferably with opposite philicity to the substrate); more preferably, a wet lithographic plate has a hydrophilic substrate and an oleophilic photosensitive layer. For waterless plate, the substrate should have an oleophilic or oleophobic surface, depending on the surface properties of the photosensitive layer (preferably with opposite philicity to the substrate).

Particularly suitable hydrophilic substrate for a wet lithographic plate is an aluminum support that has been grained and anodized; such a substrate is preferably further deposited with a hydrophilic barrier layer. Surface graining can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic plate application are well known in the art, and examples can be found in U.S. Pat. Nos. 2,714,066, 4,153,461, 4,399,021, and 5,368,974. Suitable polymer film supports for a wet lithographic plate include a polymer film coated with a hydrophilic layer, preferably a hydrophilic layer that is crosslinked, as described in U.S. Pat. No. 5,922,502.

For the plate of this application, at least the hardened areas of the photosensitive layer exhibit an affinity or aversion substantially opposite to the affinity or aversion of the substrate to at least one printing liquid selected from the group consisting of ink and an abhesive fluid for ink (including both plates with non-phase-switchable photosensitive layer and plates with phase-switchable photosensitive layer). Preferably, the photosensitive layer exhibits an affinity or aversion substantially opposite to the affinity or aversion of the substrate to at least one printing liquid selected from the group consisting of ink and an abhesive fluid for ink (as for plates with non-phase-switchable photosensitive layer, which can be wet plate or waterless plate). More preferably, the plate has a hydrophilic substrate and an oleophilic photosensitive layer (as for wet plate with non-phase-switchable photosensitive layer). An abhesive fluid for ink is a fluid that repels ink. Fountain solution is the most commonly used abhesive fluid for ink. A wet plate is printed on a wet press equipped with both ink and fountain solution, while a waterless plate is printed on a waterless press equipped with ink.

Usually, as for most printing plates described in the literature, the photosensitive layer exhibits an affinity or aversion substantially opposite to the affinity or aversion of the substrate to at least one printing liquid selected from the group consisting of ink and an abhesive fluid for ink, and does not switch its affinity or aversion upon laser exposure. However, certain photosensitive layer exhibits substantially the same affinity or aversion as the substrate and is capable of switching to opposite affinity or aversion upon exposure to a laser (with or without further treatment such as on-press development with ink and/or fountain solution), as described in U.S. Pat. Nos. 6,331,375, 5,910,395, 6,720,464, and 6,136,503. Both non-phase-switchable photosensitive layer and phase-switchable photosensitive layer can be used for the current invention. Preferred is a non-phase-switchable photosensitive layer (coated on a substrate with opposite affinity or aversion). More preferred is an oleophilic photosensitive layer (coated on a hydrophilic substrate).

In this patent, the term color change or the term discoloration means any change on the appearance of the color, such as changing to a different color (such as from blue to green), increasing in color strength (such as becoming bluer), decreasing in color strength (such as becoming less blue), turning off of a color (such as with a blue color completely disappearing), or formation (turning on) of a color (such as from colorless to blue). The term yellow or red light means yellow light, red light, or any light with a color between yellow and red such as orange light. The term safe light means a light with a certain wavelength range being cut off, including yellow light or red light, so that it does not cause hardening of a certain photosensitive layer. The term white light means a white fluorescent light, a white incandescent light, sunlight, or any white office light. The term substantially no radiation below a wavelength means the intensity of the radiation below that wavelength is less than 1% of that for a regular 100-watt incandescent light (for home use, not focused) at a distance of 2 meters. The term substantial darkness means the intensity of the radiation is less than 1% of that for a regular 100-watt incandescent light at a distance of 2 meters. The term substantially light-tight means less than 1% of the room light can pass through. The term substantially all means at least 99%. The term "with the plate under a room light" means the plate is exposed to such room light; i.e., such room light reaches the plate. The term monomer includes both polymerizable monomer and polymerizable oligomer. The term (meth)acrylate includes acrylate and/or methacrylate (acrylate, methacrylate, or both acrylate and methacrylate).

For preparing lithographic printing plates of the current invention, any photosensitive layer is suitable which is capable of hardening upon exposure to a radiation (preferably a laser) having a wavelength selected from 200 to 1200 nm, and is soluble or dispersible in ink (for waterless plate) or in ink and/or fountain solution (for wet plate). Here hardening means becoming insoluble and non-dispersible in ink and/or fountain solution. Hardening is generally achieved through crosslinking or polymerization of the resins (polymers or monomers). A laser sensitive dye or pigment (preferably a sensitizing dye) is preferably added in the photosensitive layer. The photosensitive layer preferably has a coverage of from 100 to 4000 mg/m$^2$, and more preferably from 400 to 2000 mg/m$^2$.

Preferably, the photosensitive layer comprises a polymerizable monomer and an initiating system, optionally with addition of a polymeric binder. The initiating system generally comprises an initiator; an initiator and a sensitizing dye; or an initiator, a sensitizing dye and a hydrogen donor; depending on the specific photosensitive layer. Either one species (such as 1 initiator or 1 polymer) or more than one species of the same component type (such as 2 different initiators or 3 different monomers) can be added in the same photosensitive layer. The composition ratios (such as monomer to polymer ratio) are usually different from conventional plates designed for development with a regular liquid developer. Various additives may be added to, for example, allow or enhance on-press developability. Such additives include surfactant, plasticizer, water soluble polymer or small molecule, and ink soluble polymer or small molecule. The addition of nonionic surfactant is especially helpful in making the photosensitive layer dispersible with ink and fountain solution, or emulsion of ink and fountain solution. Various additives useful for conventional photosensitive layer can also be used. These additives include pigment, dye, exposure indicator, and stabilizer.

Photosensitive materials useful in wet plates of this invention include, for example, photosensitive compositions comprising a polymerizable monomer, an initiator, a sensitizing dye, and optionally a polymeric binder.

Photosensitive oleophobic materials useful in waterless plates of this invention include, for example, compositions comprising a monomer having perfluoroalkyl or polysiloxane groups and crosslinkable terminal groups, an initiator, and a sensitizing dye.

Infrared laser sensitive (also called thermosensitive) materials useful for wet lithographic plates of this invention include, for example, thermosensitive compositions comprising a polymerizable monomer, an initiator, an infrared absorbing dye, and optionally a polymeric binder.

Visible or ultraviolet light sensitive materials useful for wet plates of this invention include, for example, photosensitive compositions comprising a polymerizable monomer, an initiator, a visible or ultraviolet light sensitizing dye, and optionally a polymeric binder. A hydrogen donor is preferably added to accelerate the polymerization.

Polymeric binder for the photosensitive layer of this invention can be any solid film-forming polymer. Such polymer may or may not have (meth)acrylate groups or other ethylenic groups (such as allyl groups). Examples of suitable polymeric binders include (meth)acrylic polymers and copolymers (such as polybutylmethacrylate, polyethylmethacrylate, polymethylmethacrylate, polymethylacrylate, butylmethacrylate/methylmethacrylate copolymer, methylmethacrylate/methylmethacrylic acid copolymer, polyallylmethacrylate, and allylmethacrylate/methacrylic acid copolymer), polyvinyl acetate, polyvinyl butyrate, polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, polyurethane binder, and polymeric binder having polymer backbone with recurring units having pendant poly(alkylene glycol) side chains. The polymeric binder suitable for the photosensitive layer of this invention has a weight average molecular weight of at least 5,000, preferably from 10,000 to 1,000,000, more preferably from 20,000 to 500,000, and most preferably from 50,000 to 200,000 Dalton. It is noted that polymeric compounds with weight average molecular weight of less that 5,000 can also be added in the photosensitive layer of this invention; however, in order to avoid confusion, such compounds are not considered as polymeric binder and are called oligomer (without or with polymerizable groups) in this application (oligomers having polymerizable groups are also included in the definition of monomers in this application).

Suitable free-radical polymerizable monomers include any monomer or oligomer with at least one ethylenically unsaturated group. Such monomers include monofuctional, difunctional, and multifunctional (meth)acrylate monomers or oligomers, such as (meth)acrylate esters of ethylene glycol, trimethylolpropane, pentaerythritol, ethoxylated ethylene glycol and ethoxylated trimethylolpropane; multifunctional urethanated (meth)acrylate; epoxylated (meth)acrylate; and oligomeric amine (meth)acrylates. The monomers can be urethane (meth)acrylate, or non-urethane (meth)acrylate. Combination of both urethane (meth)acrylate and non-urethane (meth)acrylate monomers can be used. The monomers preferably has at least 3 (meth)acrylate groups, more preferably at least 4 (meth)acrylate groups, even more preferably at least 5 (meth)acrylate groups, and most preferably at least 6 (meth)acrylate groups. However, monofunctional or difunctional (meth)acrylate monomer can be added into the photosensitive layer having multifunctional (meth)acrylate monomers; the total amount of such monofunctional or difunctional monomers is preferably less than 50% by weight of the total monomers, more preferably less than 30%, and most preferably less than 10%. Acrylate monomer is preferred over methacrylate monomer because of the faster photospeed of acrylate group over methacrylate group. The monomer has a molecular weight of less than 5,000, preferably from 100 to 3,000, more preferably from 200 to 2,000, and most preferably from 300 to 1,500 Dalton.

Urethane (meth)acrylate monomers include any compounds having at least one urethane linkage (—NHCOO—) and at least one (meth)acrylate group. Preferred urethane (metha)acrylate monomers are those with at least 3 (meth)acrylate groups, more preferably at least 4 (meth)acrylate groups, even more preferably at least 5 (meth)acrylate groups, and most preferably at least 6 (meth)acrylate groups. Urethane (meth)acrylate monomer is usually formed by reacting a compound having at least one isocyanate group with a (meth)acrylate compound having a hydroxy group. Urethane monomer with 2 or more (meth)acrylate groups are usually formed from a compound having one or more isocyanate groups and a (meth)acrylate compound having a hydroxy group and one or more (meth)acrylate groups. For example, a tetrafunctional urethane (meth)acrylate monomer can be formed from a compound having one hydroxy group and 2 (meth)acrylate groups with a bifunctional isocyanate compound. Suitable isocyanate compounds include, for example, aromatic diisocyanate such as p-phenylene diisocyanate, 2,4-tolylene diisocyanate, 2,6-tolylene diisocyanate, 4,4'-diphenylmethane diisocyanate, naphthalene-1,5-diisocyanate and tolydine diisocyanate; aliphatic diisocyanate such as hexamethylene diisocyanate, lysinemethyl ester diisocyanate, 2,4,4-trimethylhexamethylene diisocyanate and dimer acid diisocyanate; alicyclic diisocyanate such as isophorone diisocyanate, and 4,4'-methylenebis(cyclohexylisocyanate); aliphatic diisocyanate having an aromatic ring, such as xylylene diisocyanate; triisocyanate such as lysine ester triisocyanate, 1,6,11-undecane triisocyanate, 1,8-diisocyanate-4-isocyanatemethyloctane, 1,3,6-hexamethylene triisocyanate, bicycloheptane triisocyanate, tris(isocyanate phenylmethane) and tris(isocyanatephenyl)thiophosphate; and polyisocyanate formed from condensation of three or more diisocyanate compounds such as 2,4-tolylene diisocyanate isocyanurate trimer, 2,4-tolylene diisocyanate-trimethylolpropane adduct, 1,6-hexanediisocyante isocyanurate trimer. Suitable (meth)acrylate compounds with one hydroxy group include pentaerythritol tri(meth)acrylate, dipentaerythritol penta(meth)acrylate, ditrimethylolpropane tri (meth)acrylate and pentaerythritol di(meth)acrylate monostearate. Various urethane (meth)acrylate monomers are described in U.S. Pat. No. 6,232,038 and U.S. Pat. Pub. No. 2002/0018962, and can be used as the urethane (meth)acrylate monomers of this instant invention. Among the urethane (meth)acrylate monomers, urethane acrylate monomer is preferred. Either aromatic urethane (meth)acrylate monomer (which contains at least one aromatic group in the molecule) or aliphatic urethane (meth)acrylate monomer (which does not contain any aromatic group in the molecule) or both can be used in a photosensitive layer of this invention.

Suitable non-urethane (meth)acrylate monomers can be any (meth)acrylate monomers without urethane linkage (—NHCOO—) in the molecule. Suitable non-urethane (meth)acrylate monomers include, for example, trimethylolpropane triacrylate, pentaerythritol tetra(meth)acrylate, dipentaerythritol penta(meth)acrylate, dipentaerythritol hexa (meth)acrylate, di(trimethylolpropane) tetra(meth)acrylate. Among the non-urethane (meth)acrylate monomers, non-urethane acrylate monomer is preferred.

Suitable free-radical initiators include, for example, the derivatives of acetophenone (such as 2,2-dimethoxy-2-phenylacetophenone, and 2-methyl-1-[4-(methylthio)phenyl]-2-morpholino propan-1-one), onium salts such as diaryliodonium hexafluoroantimonate, diaryliodonium hexafluorophosphate, diaryliodonium triflate, (4-(2-hydroxytetradecyl-oxy)phenyl)phenyliodonium hexafluoroantimonate, (4-octoxyphenyl)phenyliodonium hexafluoroantimonate, bis(4-t-butylphenyl)iodonium hexafluorophosphate, triarylsulfonium hexafluorophosphate, triarylsulfonium p-toluenesulfonate, (3-phenylpropan-2-onyl) triaryl phosphonium hexafluoroantimonate and N-ethoxy(2-methyl)pyridinium hexafluorophosphate, and the onium salts as described in U.S. Pat. Nos. 5,955,238, 6,037,098 and 5,629,354; borate salts such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and the borate salts as described in U.S. Pat. Nos. 6,232,038 and 6,218,076; haloalkyl substituted s-triazines such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis (trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354; titanocene compounds such as bis($\eta_9$-2,4-cyclopentadien-1-yl) bis[2,6-difluoro-3-(1H-pyrrol-1-yl)phenyl) titanium; hexaarylbiimidazole compounds such as 2,2'-bis(2-chlorophenyl)-4,4',5,5'-tetraphenyl-1,1'-biimidazole, 2,2'-bis(2-ethoxyphenyl)-4,4', 5,5'-tetraphenyl-1,1'-biimidazole, 2-(1-naphthyl)-4,5-diphenyl-1,2'-biimidazole; and derivatives of acetophenone such as 2,2-dimethoxy-2-phenylacetophenone, and 2-methyl-1-[4-(methylthio)phenyl]-2-morpholino propan-1-one. Triarylsulfonium salts, diaryliodonium salts, and triarylalkylborate salts are preferred initiators for infrared laser sensitive plate. Titanocene compounds and hexaarylbiimidazole compounds are preferred initiators for visible or ultraviolet laser sensitive plate, and hexaarylbiimidazole compounds are more preferred. The initiator is added in the photosensitive layer preferably at 0.1 to 40% by weight of the photosensitive layer, more preferably 1 to 30%, and most preferably 5 to 20%.

Infrared sensitizing dyes useful in the thermosensitive layer of this invention include any infrared absorbing dye effectively absorbing an infrared radiation having a wavelength of 750 to 1200 nm. It is preferable that the dye has an absorption maximum between the wavelengths of 780 and 1100 nm. Various infrared absorbing dyes are described in U.S. Pat. Nos. 5,858,604, 5,922,502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. The infrared laser sensitizing dye is added in the photosensitive layer preferably at 0.1 to 20% by weight of the photosensitive layer, more preferably 0.5 to 10%, and most preferably 1 to 5%.

Visible or ultraviolet sensitizing dyes useful in the visible or ultraviolet sensitive photosensitive layer of this invention include any dyes having a wavelength maximum of from 200 to 600 nm. Suitable visible or ultraviolet sensitive dyes include, for example, cyanine dyes; rhodamine compounds such as rhodamine 6G perchloride; chromanone compounds such as 4-diethylaminobenzilidene chromanone; dialkylaminobenzene compounds such as ethyl 4-dimethylaminobenzoate and dialkylaminobenzene; dialkylaminobenzophenone compounds such as 4,4'-bis(dimethylamino)benzophenone, 4,4'-bis(diethylamino)benzophenone, 2-(p-dimethylaminophenyl)benzooxazole, 2-(p-diethylaminophenyl)benzooxazole, 2-(p-dimethylaminophenyl)benzo[4,5]benzooxazole, 2-(p-dimethylaminophenyl)benzo[6,7]benzooxazole, 2,5-bis(p-diethylaminophenyl) 1,3,4-oxazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole, 2,5-bis(p-diethylaminophenyl)1,3,4-thiadiazole, (p-dimethylaminophenyl)pyridine, (p-diethylaminophenyl) pyridine, 2-(p-dimethylaminophenyl)quinoline, 2-(p-diethylaminophenyl)quinoline, 2-(p-dimethylaminophenyl)pyrimidine or 2-(p-diethylaminophenyl)pyrimidine; unsaturated cyclopentanone compounds such as 2,5-bis{[4-(diethylamino)phenyl]methylene}-(2E,5E)-(9Cl)-cyclopentanone and bis(methylindolenyl)cyclopentanone; coumarin compounds such as 3-benzoyl-7-methoxy coumarin and 7-methoxy coumarin; and thioxanthene compounds such as 2-isopropylthioxanthenone. Dialkylaminobenzene compounds and bis(dialkylamino)benzophenone compounds are particularly suitable for ultraviolet laser sensitive plate. Bis(dialkylamino)benzophenone compounds are particularly suitable for violet laser sensitive plate. The sensitizing dyes as described in U.S. Pat. Nos. 5,422,204 and 6,689,537, and U.S. Pat. App. Pub. No. 2003/0186165 can be used for the photosensitive layer of this invention. The visible or ultraviolet laser sensitizing dye is added in the photosensitive layer preferably at 0.1 to 20% by weight of the photosensitive layer, more preferably 0.5 to 15%, and most preferably 1 to 10%.

The free radical polymerizable photosensitive composition of the present invention can contain one or more hydrogen donors as polymerization accelerator. Examples of the hydrogen donors include compounds having a mercapto group (also called mercapto compounds) such as 2-mercaptobenzothiazole, 2-mercaptobenzimidazole, 2-mercaptobenzoxazole and 3-mercapto-1,2,4-triazole; and N-aryl-α-amino acids, their salts and esters such as N-phenylglycine, salts of N-phenylglycine, and alkyl esters of N-phenylglycine such as N-phenylglycine ethyl ester and N-phenylglycine benzyl ester. Preferred hydrogen donors are 2-mercaptobenzothiazole, 2-mercaptobenzimidazole, 2-mercaptobenzoxazole, 3-mercapto-1,2,4-triazole, N-phenylglycine, N-phenylglycine ethyl ester, and N-phenylglycine benzyl ester. Combination of at least one mercapto compound and at least one N-aryl-α-amino acid or its ester or salt can be advantageously used in the photosensitive layer to increase the photospeed. The hydrogen donor is preferably added in the photosensitive layer at 0.01 to 15% by weight of the photosensitive layer, more preferably 0.1 to 10%, and most preferably 0.5 to 5%.

Various surfactants can be added into the photosensitive layer to allow or enhance the on-press developability with ink and/or fountain. Both polymeric and small molecule surfactants can be used. However, it is preferred that the surfactant has low or no volatility so that it will not evaporate from the photosensitive layer of the plate during storage and handling. Nonionic surfactants are preferred. The nonionic surfactant used in this invention should have sufficient portion of hydrophilic segments (or groups) and sufficient portion of oleophilic segments (or groups), so that it is at least partially soluble in water (>1 g surfactant soluble in 100 g water) and at least partially soluble in organic phase (>1 g surfactant soluble in 100 g photosensitive layer). Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 30% by weight of the photosensitive layer, more preferably from 0.5 to 20%, and most preferably from 1 to 15%.

A hydrophilic or oleophilic micro particles may be added into the photosensitive layer to enhance, for example, the developability and non-tackiness of the plate. Suitable micro particles include polymer particles, talc, titanium dioxide, barium sulfate, silicone oxide, and aluminum micro particles, with an average particle size of less than 10 microns, preferably less than 5 microns, more preferably less than 2 microns, and most preferably less than 1 microns. A suitable particular dispersion is described in U.S. Pat. No. 6,071,675, the entire disclosure of which is hereby incorporated by reference.

For plates with rough and/or porous surface capable of mechanical interlocking with a coating deposited thereon, a thin water-soluble interlayer may be deposited between the substrate and the photosensitive layer. Here the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is the preferred water-soluble polymer. Usually pure water-soluble polymer is coated. However, one or more surfactant and other additives may be added. The water-soluble polymer is generally coated from an aqueous solution with water as the only solvent. A water-soluble organic solvent, preferably an alcohol such as ethanol or isopropanol, can be added into the water-soluble polymer aqueous coating solution to improve the coatability. The water-soluble organic solvent is preferably added at less than 20% by weight of the solution, more preferably at less than 10%. The releasable interlayer preferably has an average coverage of 1 to 200 mg/m$^2$, more preferably 2 to 100 mg/m$^2$, and most preferably 4 to 40 mg/m$^2$. The substrate preferably has an average surface roughness Ra of 0.2 to 2.0 microns, and more preferably 0.4 to 1.0 microns.

The photosensitive layer may be conformally coated onto a roughened substrate (for example, with Ra of larger than 0.4 microns) at thin coverage (for example, of less than 1.2 g/m$^2$) so that the plate can have microscopic peaks and valleys on the photosensitive layer coated surface and exhibit low tackiness and good block resistance, as described in U.S. Pat. No. 6,242,156, the entire disclosure of which is hereby incorporated by reference.

An ink and/or fountain solution soluble or dispersible overcoat can be coated on the photosensitive layer to, for example, improve the photospeed, surface durability, and/or developability of the plate. Preferred is a water soluble or dispersible overcoat. The overcoat preferably comprises a water-soluble polymer, such as polyvinyl alcohol (including various water-soluble derivatives of polyvinyl alcohol). Combination of two or more water-soluble polymers (such as a combination of polyvinyl alcohol and polyvinylpyrrolidone) may also be used. Polyvinyl alcohol is a preferred water-soluble polymer. Various additives, such as surfactant, wetting agent, defoamer, leveling agent and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic emulsion or dispersion may be added into the overcoat to, for example, reduce the tackiness or moisture sensitivity of the plate. The overcoat preferably has a coverage of from 0.001 to 4.0 g/m$^2$, more preferably from 0.01 to 2.0 g/m$^2$, and most preferably from 0.1 to 1.0 g/m$^2$.

In a preferred embodiment for the thermosensitive lithographic printing plate of this invention, the thermosensitive layer comprises a polymeric binder, a polymerizable ethylenically unsaturated monomer having at least one terminal ethylenic group, a free-radical initiator, and an infrared absorbing dye. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added. The weight ratio of all the monomers to all the polymeric binders is preferably at least 1.0, more preferably at least 1.5, and most preferably at least 2.0.

In another preferred embodiment for the thermosensitive lithographic printing plates of this invention, the thermosensitive layer comprises a polymeric binder, a urethane (meth)acrylate monomer having at least 4 (meth)acrylate groups, a free-radical initiator, and an infrared absorbing dye.

In yet another preferred embodiment for the thermosensitive lithographic printing plates of this invention, the thermosensitive layer comprises a polymeric binder having polymer backbone with recurring units having pendant poly(alkylene glycol) side chains, a (meth)acrylate monomer having at least one (meth)acrylate group, a free-radical initiator, and an infrared absorbing dye.

In a preferred embodiment for visible light sensitive lithographic printing plates of this invention, the photosensitive layer comprises a polymeric binder, a polymerizable ethylenically unsaturated monomer having at least one terminal ethylenic group, a free-radical initiator, and a visible sensitizing dye. A hydrogen donor is preferably added to increase the photospeed. Other additives such as surfactant, dye or pigment, exposure-indicating dye, and free-radical stabilizer may be added. The weight ratio of all the monomers to all the polymeric binders is preferably at least 1.0, more preferably at least 1.5, and most preferably at least 2.0.

In a preferred embodiment for violet or ultraviolet light sensitive lithographic printing plates of this invention, the photosensitive layer comprises a polymeric binder, a polymerizable ethylenically unsaturated monomer having at least one terminal ethylenic group, a free-radical initiator, and a violet or ultraviolet sensitizing dye. A hydrogen donor is preferably added to increase the photospeed. Other additives such as surfactant, dye or pigment, exposure-indicating dye, and free-radical stabilizer may be added. The weight ratio of all the monomers to all the polymeric binders is preferably at least 1.0, more preferably at least 1.5, and most preferably at least 2.0.

In another preferred embodiment for the violet or ultraviolet laser sensitive lithographic plates of this invention, the photosensitive layer comprises a polymeric binder, a monomer having at least 3 (meth)acrylate group, a hexaarylbiimidazole or titanocene compound, a dialkylaminobenzophenone compound, and a hydrogen donor. The weight ratio of the all the monomers to all the polymeric binders is preferably at least 1.0, more preferably from 1.5 to 6.0, and most preferably from 2.0 to 5.0. A hexaarylbiimidazole compound is preferred among hexaarylbiimidazole and titanocene compounds. A preferred dialkylaminobenzophenone compound is a 4,4'-bis(dialkylamino)benzophenone compound.

In yet another preferred embodiment for the violet or ultraviolet laser sensitive lithographic plates of this invention, the photosensitive layer comprises a polymeric binder, a urethane monomer having at least 4 (meth)acrylate group, a hexaarylbiimidazole or titanocene compound, a dialkylaminobenzophenone compound, and a hydrogen donor. The weight ratio of the all the monomers to all the polymeric binders is preferably at least 0.5, more preferably from 1.0 to 6.0, and most preferably from 2.0 to 5.0. A hexaarylbiimidazole compound is preferred among hexaarylbiimidazole and titanocene compounds. A preferred dialkylaminobenzophenone compound is a 4,4'-bis(dialkylamino)benzophenone compound. A non-urethane (meth)acrylate monomer can be added.

In further another preferred embodiment for the violet or ultraviolet laser sensitive lithographic plates of this invention, the photosensitive layer comprises a polymeric binder, a urethane monomer having at least 4 (meth)acrylate group, a non-urethane monomer having at least 4 (meth)acrylate groups, a hexaarylbiimidazole or titanocene compound, a dialkylaminobenzophenone compound, and a hydrogen donor. The weight ratio of the urethane (meth)acrylate monomer to the non-urethane (meth)acrylate monomer is preferably from 0.10 to 10.0, more preferably from 0.20 to 5.0, and most preferably from 0.30 to 3.0. The weight ratio of all the monomers to all the polymeric binders is preferably at least 0.5, more preferably from 1.0 to 6.0, even more preferably from 1.5 to 5.0, and most preferably from 2.0 to 4.0. A hexaarylbiimidazole compound is preferred among hexaarylbiimidazole and titanocene compounds. A preferred dialkylaminobenzophenone compound is a 4,4'-bis(dialkylamino)benzophenone compound.

In yet further another preferred embodiment for the violet or ultraviolet laser sensitive lithographic plates of this invention, the photosensitive layer comprises a polymeric binder having polymer backbone with recurring units having pendant poly(alkylene glycol) side chains, a (meth)acrylate monomer having at least one (meth)acrylate group, a free-radical initiator, and a violet or ultraviolet sensitizing dye. A hydrogen donor is preferably added. Other additives such as surfactant, dye or pigment, exposure-indicating dye, and free-radical stabilizer may be added.

For preparing lithographic printing plate capable of discoloration with a discoloring solution, the above plates preferably further comprise a visible dye, a dispersed pigment, or a latent dye in the photosensitive layer.

The on-press developable lithographic plates as described in U.S. Pat. Nos. 6,482,571, 6,576,401, 5,548,222, and 6,541,183, and U.S. patent application Ser. Nos. 10/720,882, 11/075,663, 11/175,518, 11/266,817, 11/356,911, 11/728,648, 11/787,878, 11/800,634, and 11/810,710, the entire disclosures of which are hereby incorporated by reference, can be used for the instant invention, with or without further addition of a certain additive such as a visible dye, dispersed pigment, or latent dye in the photosensitive layer.

Infrared lasers useful for the imagewise exposure of the thermosensitive plates of this invention include laser sources emitting in the near infrared region, i.e. emitting in the wavelength range of from 750 to 1200 nm, and preferably from 800 to 1100 nm. Particularly preferred infrared laser sources are laser diodes emitting around 830 nm or a NdYAG laser emitting around 1060 nm. The plate is exposed at a laser dosage that is sufficient to cause hardening in the exposed areas but not high enough to cause substantial thermal ablation. The exposure dosage is preferably from 1 to 500 $mJ/cm^2$ more preferably from 5 to 200 $mJ/cm^2$, and most preferably from 20 to 150 $mJ/cm^2$, depending on the sensitivity of the thermosensitive layer.

Visible lasers useful for the imagewise exposure of the visible light sensitive plates of this invention include any laser emitting in the wavelength range of from 390 to 600 nm. Examples of suitable visible lasers include frequency-doubled Nd/YAG laser (about 532 nm), argon ion laser (about 488 nm), violet diode laser (about 405 nm), and visible LEDs. Violet laser diode is especially useful because of its small size and relatively low cost. The exposure dosage is preferably from 0.0001 to 5 $mJ/cm^2$ (0.1 to 5000 $\mu J/cm2$), more preferably from 0.001 to 0.5 $mJ/cm^2$ (1 to about 500 $\mu J/cm^2$), and most preferably from 0.005 to 0.10 $mJ/cm2$ (5 to 100 $\mu J/cm^2$), depending on the sensitivity of the photosensitive layer.

Ultraviolet lasers useful for the imagewise exposure of the ultraviolet light sensitive plates of this invention include any laser having a wavelength of from 200 to 390 nm. Examples of ultraviolet lasers include ultraviolet diode lasers or LEDs having a wavelength of from 350 to 390 nm. Laser diodes are preferred ultraviolet lasers. The exposure dosage is preferably from 0.0001 to 5 $mJ/cm^2$ (0.1 to 5000 $PJ/cm^2$), more preferably from 0.001 to 0.5 $mJ/cm^2$ (1 to about 500 $\mu J/cm^2$), and most preferably from 0.005 to 0.10 $mJ/cm^2$ (5 to 100 $\mu J/cm^2$), depending on the sensitivity of the photosensitive layer.

Among the visible and ultraviolet lasers, violet or ultraviolet laser with a wavelength selected from 200 to 430 nm, preferably from 300 to 430 nm, is particularly useful.

Laser imaging devices are currently widely available commercially. Any device can be used which provides imagewise laser exposure according to digital imaging information. Commonly used imaging devices include flatbed imager, internal drum imager, and external drum imager, all of which can be used for the imagewise laser exposure in this invention.

The plate can be exposed (preferably with a laser) on an exposure device, treated with a treating solution (preferably on a treating device, which can be standalone or can be connected to or part of the exposure device, preferably connected to or part of the exposure device), and then mounted on press to develop with ink and/or fountain solution and then print out regular printed sheets. The ink and/or fountain solution solubilized or dispersed photosensitive layer and/or overcoat can be mixed into the ink and/or the fountain solution on the rollers, and/or can be transferred to the blanket and then the receiving medium (such as paper). The fountain solution roller is engaged (to the plate cylinder as for conventional inking system or to the ink roller as for integrated inking system) for preferably 0 to 100 rotations, more preferably 1 to 50 rotations and most preferably 5 to 20 rotations (of the plate cylinder), and the ink roller is then engaged to the plate cylinder for preferably 0 to 100 rotations, more preferably 1 to 50 rotations and most preferably 5 to 20 rotations before engaging the plate cylinder and feeding the receiving medium. Good quality prints should be obtained preferably under 40 initial impressions, more preferably under 20 impressions, and most preferably under 5 impressions.

For conventional wet press, usually fountain solution is applied (to contact the plate) first, followed by contacting with ink roller. For press with integrated inking/dampening system, the ink and fountain solution are emulsified by various press rollers before being transferred to the plate as emulsion of ink and fountain solution. However, in this invention, the ink and fountain solution may be applied at any combination or sequence, as needed for the plate. There is no particular limitation. The recently introduced single fluid ink that can be used for printing wet lithographic plate without the use of fountain solution, as described in for example U.S. Pat. No. 6,140,392, can also be used for the on-press development and printing of the plate of this invention.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which generally comprises a pigment dispersed in a vehicle, such as vegetable oils, animal oils, mineral oils, and synthetic resins. Various additives, such as plasticizer, surfactant, drier, drying retarder, crosslinker, and solvent may be added to achieve certain desired performance. The compositions of typical lithographic inks are described in "The Manual of Lithography" by Vicary, Charles Scribner's Sons, New York, and Chapter 8 of "The Radiation Curing Science and Technology" by Pappas, Plenum Press, New York, 1992.

The fountain solution used in this application can be any fountain solution used in lithographic printing. Fountain solution is used in wet lithographic printing press to dampen the hydrophilic areas (non-image areas), repelling ink (which is hydrophobic) from these areas. Fountain solution contains mainly water, generally with addition of certain additives such as gum arabic and surfactant. Small amount of alcohol such as isopropanol can also be added in the fountain solution. Water is the simplest type of fountain solution. Fountain solution is usually neutral to mildly acidic. However, for certain plates, mildly basic fountain solution is used. The type of fountain solution used depends on the type of the plate substrate as well as the photosensitive layer. Various fountain solution compositions are described in U.S. Pat. Nos. 4,030,417 and 4,764,213.

Emulsion of ink and fountain solution is an emulsion formed from ink and fountain solution during wet lithographic printing process. Because fountain solution (containing primarily water) and ink are not miscible, they do not form stable emulsion. However, emulsion of ink and fountain solution can form during shearing, compressing, and decompressing actions by the rollers and cylinders, especially the ink rollers and plate cylinder, on a wet lithographic press. For wet press with integrated inking system, ink and fountain solution are emulsified on the ink rollers before transferred to the plate.

The imagewise exposure and treatment of this invention can be performed with the plate under any lightings (including darkness) at least for certain amount of time, as long as the exposure to such lightings for such amount of time will not cause hardening of the photosensitive layer; such lighting can be a yellow or red light (for preferably limited time, more preferably less than 120 minutes, and most preferably less than 30 minutes), darkness or substantial darkness, or white light (for preferably limited time, more preferably less than 60 minutes, and most preferably less than 10 minutes). Preferably, the laser exposure is performed with the plate under lightings (including darkness) that will not cause hardening of the photosensitive layer (even after long exposure); more preferably, under lightings containing no or substantially no radiation below a wavelength selected from 400 to 650 nm (such as 500 nm), or in darkness or substantial darkness; and most preferably under lightings containing no radiation below a wavelength selected from 400 to 650 nm, or in darkness. The lighting containing no or substantially no radiation below a wavelength selected from 400 to 650 nm (such as 500 nm) is usually a yellow or red light. This includes a light that is from a fluorescent or incandescent lamp covered with a filter that cuts off all or substantially all (at least 99%) of the radiation below a wavelength selected from 400 to 650 nm; preferably the lamp is covered with a filter that cuts off all of the radiation below a wavelength selected from 400 to 650 nm. The laser exposure and the treatment can be performed with the plate under the same or different lightings. Preferably, the treating solution contains a deactivating agent, in addition to possibly other active ingredient (such as a discoloring agent or a development enhancer), so that the photosensitive layer in the non-hardened areas is deactivated (in addition to possibly other chemical or physical change such as discoloration or softening) during the treatment.

The plate can be imaged on a laser imager and then treated on a treating device. The plate can be manually or automatically handled between the imager and treating device. The imager and treating device may stay open to the room light which is a white light or a yellow or red light, preferably a yellow or red light, depending on the sensitivity of the plate. For plate sensitive to the room light, the exposure time to such room light should be limited (to preferably less than 120 minutes and more preferably less than 20 minutes).

For a plate with photosensitive layer which is sensitive to a room light (such as causing hardening or background toning after exposure to a yellow light for 60 minutes or to a white light for 10 minutes), the treating solution preferably contains a deactivating agent capable of deactivating the photo hardening capability of the photosensitive layer in the non-hardened areas. The plate can be imaged on a laser imager, and treated on a treating device, preferably in a room which has a lighting that contains no or substantially no radiation below a wavelength selected from 400 to 650 nm; the plate can be manually or automatically handled between the imager and treating device; the imager and treating device can stay open to the room light. Alternatively, the plate can be packaged in a substantially light-tight cassette to feed to the exposure device that is designed to be substantially light-tight for the plate, with the plate covered with substantially light-tight covers; the plate can be automatically transferred to the treating device, with the plate staying within the substantially light-tight covers all or substantially all the time until it has been deactivated during the treatment; the room lighting can be a white light. Further alternatively, the above automatic processes can be designed so that the substantially light-tight covers have some light-filtering windows which are only transparent to radiation above a wavelength selected from 400 to 650 nm (such as 500 nm), so that the operator can visually monitor the plate during imaging, and/or treatment (which includes deactivation).

This invention is further illustrated by the following examples of its practice.

EXAMPLES 1-6

An electrochemically grained, anodized, and silicated aluminum sheet was coated with the photosensitive layer formulation PS-1 with a #8 Meyer rod, followed by drying in an oven at 100° C. for 2 min. All the coatings were performed under a yellow light.

| PS-1 | |
| --- | --- |
| Component | Weight (g) |
| Neocryl B-728 (Polymer from Zeneca) | 2.48 |
| Ebecryl 220 (Monomer from UCB Chemicals) | 1.64 |
| Sartomer SR-399 (Monomer from Sartomer Company) | 4.29 |
| Pluronic L43 (Surfactant from BASF) | 0.51 |
| Leucomalachite green (Exposure indicator) | 0.53 |
| 2,6-Di-tert-butyl-4-methylphenol (Antioxidant) | 0.01 |
| Irganox 1035 (Antioxidant from Ciba-Geigy) | 0.01 |
| 4-piperonyl-2,6-bis(trichloromethyl)-s-triazine (Initiator) | 0.52 |
| 2-Butanone | 90.00 |

The plate was open to an office white fluorescence light for 60 minutes to turn on the green color from the leuco malachite green. The office-light exposed plate has bright blue color all over the photosensitive layer of the plate, with the coating remaining non-hardened (still developable with ink and fountain solution). This green-colored plate was imagewise exposed through a negative mask to an ultraviolet light with an emission maximum of about 365 nm under vacuum for 2 minutes, using an ultraviolet light exposure device with a 1000 watts light bulb (INSTANT 2 VACUUM PRINTER 24×28, from Berkey Technical Co., New York). The imagewise exposed areas showed greener color. This imagewise exposed plate was cut into 6 sheets for further evaluation.

The first sheet of the imagewise exposed plate was dipped in a 10% citric acid aqueous solution for 20 seconds and then dried naturally at room temperature. The color in the non-imagewise exposed areas faded significantly while the color in the imagewise exposed areas showed essentially no change, giving sharper image contrast on the photosensitive layer. The sharp image contrast remained substantially unchanged under white office light. The treated plate was then mounted on the plate cylinder of an AB Dick 360 lithographic press to test for on-press development and printing. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions (no further test was conducted). The plate rolled up to clean background, good inking, and 1-98% resolution under 10 impressions (of printed sheets), with no wearing observed at 200 impressions.

The second sheet of the imagewise exposed plate was tested the same as with the first sheet except that the plate was treated with a 5% acetic acid aqueous solution instead of citric acid solution. After dipping the plate in the acetic acid solution for 20 seconds, the color in the non-hardened areas faded while the color in the hardened areas remained unchanged. The plate tested on press rolled up to clean background, good inking, and 1-98% resolution under 10 impressions, with no wearing observed at 200 impressions.

The third sheet of the imagewise exposed plate was tested the same as with the first sheet except that the plate was treated with a household bleach Clorox (containing 5.8% sodium hypochlorite and 0.5-1% sodium hydroxide in water, from Clorox Company) instead of citric acid solution. After dipping the plate in Clorox for 60 seconds, the color in the non-hardened areas faded while the color in the hardened areas remained substantially unchanged. The plate tested on press gave roll up to clean background, good inking, and 1-98% resolution under 10 impressions, with no wearing observed at 200 impressions.

The fourth sheet of the imagewise exposed plate was tested the same as with the first sheet except that the plate was treated with a 0.2% by weight sodium hydroxide aqueous solution instead of citric acid solution. After dipping the plate in the sodium hydroxide solution for 20 seconds, the color in the non-hardened areas faded while the color in the hardened areas remained substantially unchanged. The plate tested on press rolled up to clean background, good inking, and 1-98% resolution under 10 impressions, with no wearing observed at 200 impressions.

The fifth sheet of the imagewise exposed plate was tested the same as with the first sheet except that the plate was treated with a 0.4% by weight potassium hydroxide aqueous solution instead of citric acid solution. After dipping the plate in the potassium hydroxide solution for 20 seconds, the color in the non-hardened areas faded while the color in the hardened areas remained substantially unchanged. The plate tested on press rolled up to clean background, good inking, and 1-98% resolution under 10 impressions, with no wearing observed at 200 impressions.

The sixth sheet of the imagewise exposed plate was tested the same as with the first sheet except that the plate was treated with a 4% by weight sodium silicate aqueous solution instead of citric acid solution. After dipping the plate in the sodium silicate solution for 60 seconds, the color in the non-hardened areas faded while the color in the hardened areas remained substantially unchanged. The plate tested on press rolled up to clean background, good inking, and 1-98% resolution under 10 impressions, with no wearing observed at 200 impressions.

EXAMPLE 7

An electrochemically grained, anodized, and phosphate-fluoride treated aluminum sheet was first coated with a 0.1% aqueous solution of polyvinyl alcohol (Airvol 540, from Air Products) with a #6 Meyer rod, followed by drying in an oven at 100° C. for 2 min. The polyvinyl alcohol coated substrate was further coated with the photosensitive layer formulation PS-2 with a #6 Meyer rod, followed by drying in an oven at 100° C. for 2 min.

| PS-2 | |
|---|---|
| Component | Weight (g) |
| Carboset 527 (Alkaline soluble polymeric binder with acid number of 80, from B. F. Goodrich) | 1.93 |
| Ebecryl 220 (Blend of a hexafunctional aromatic acrylate monomer and a tetrafunctional non-urethane aliphatic | 5.43 |
| Renol Blue B2G-HW (Blue pigment dispersed in polyvinyl-butyral from Clariant) | 0.42 |
| Pluronic L43 (Nonionic surfactant from BASF) | 0.53 |
| 2,2-Bis(2-chlorophenyl)-4,4',5,5'-tetraphenyl-1,1'-biimidazole | 1.09 |
| 4,4'-Bis(diethylamino)benzophenone | 0.49 |
| 2-Mercaptobenzoxazole | 0.12 |
| Acetone | 27.00 |
| 2-Methoxypropanol | 63.00 |

The photosensitive layer coated plate was further coated with a water-soluble overcoat OC-1 using a #6 Meyer rod, followed by hot air blow drying and baking in an oven at 100° C. for 2 min. All the coatings were performed under a red light and the plate was then stored in a light tight box.

| OC-1 | |
|---|---|
| Component | Weight ratios |
| Airvol 205 (Polyvinyl alcohol from Air Products) | 0.2 |
| Dioctyl sulfosuccinate sodium salt (surfactant) | 0.01 |
| Water | 99.8 |

The plate was exposed with a violet plate imager equipped with a 60 mw violet laser diode emitting at about 405 nm (MAKO-8 from ECRM) for a dosage of about 90 $\mu$J/cm$^2$. The plate was imaged in an orange light room (with Fuji Yellow FV30 lights from Encapsulite), and was kept in a light tight box before and after imaging.

The laser exposed plate was treated with a solution containing 10% by weight citric acid in a blend of acetone and water at a weight ratio of 1:1 by dipping in the solution for 20 seconds, followed by hot air blow drying with a hair drier to remove the water and solvent. The treated plate was evaluated at white office light. The exposed areas showed essentially unchanged original blue color, while non-exposed areas showed dull, less blue color.

The treated plate was further mounted on the plate cylinder of an AB Dick 360 lithographic press for on-press development and printing tests, under white room light. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. The plate rolled up to clean background, good inking, and 2-98% resolution under 20 impressions, with no wearing observed at 200 impressions.

EXAMPLES 8-11

A plate prepared and imagewise exposed the same as in EXAMPLE 7 was treated with a solution containing 10% by weight citric acid aqueous solution by dipping in the solution for 30 seconds, followed by air drying to dry off the overflowing liquid. Half of the treated plate (with the other half covered with a red masking sheet) was exposed to a 1000 watts ultraviolet light for 1 minute on an ultraviolet light exposure device (INSTANT 2 VACUUM PRINTER 24×28, from Berkey Technical Co., New York).

The treated plate was further mounted on the plate cylinder of an AB Dick 360 lithographic press for on-press development and printing tests, under white room light. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. Both the ultraviolet exposed half and the ultraviolet non-exposed half of the plate rolled up to clean background and good inking 20 impressions (of printed sheets). The plate exposed with ultraviolet light showed 1-98% resolution, compared to 2-98% for the plate not exposed with ultraviolet light.

Another plate prepared and imagewise exposed the same as in EXAMPLE 7 was directly exposed to the same 1000 watts ultraviolet light for 1 minute, without any treatment. The plate was tested on press the same as above. Both the imagewise non-exposed areas and imagewise exposed areas took ink, indicating hardening of the whole plate.

Yet another plate prepared and imagewise exposed the same as in EXAMPLE 7 was exposed to the office white fluorescence light for 10 minutes, without any treatment. The plate was tested on press the same as above. Both the imagewise non-exposed areas and imagewise exposed areas took ink, indicating hardening of the whole plate.

EXAMPLES 12-14

An electrochemically grained, anodized, and polyvinylphosphonic acid treated aluminum sheet was first coated with a 0.1% aqueous solution of polyvinyl alcohol (Airvol 540, from Air Products) with a #6 Meyer rod, followed by drying in an oven at 100° C. for 2 min. The polyvinyl alcohol coated substrate was further coated with the photosensitive layer formulation PS-3 with a #8 Meyer rod, followed by drying in an oven at 90° C. for 2 min.

| PS-3 | |
|---|---|
| Component | Weight ratios |
| Neocryl B-728 (Polymer from Zeneca) | 2.75 |
| DPHA (Acrylic monomer from UCB Chemicals) | 6.56 |
| Pluronic L43 (Nonionic surfactant from BASF) | 0.56 |
| 2,2-Bis(2-chlorophenyl)-4,4',5,5'-tetraphenyl-1,1'-biimidazole | 1.21 |
| 4,4'-Bis(diethylamino)benzophenone | 0.77 |
| 2-Mercaptobenzoxazole | 0.15 |
| 2-Butanone | 88.00 |

The photosensitive layer coated plate was further coated with a water-soluble overcoat OC-2 using a #6 Meyer rod, followed by drying in an oven at 100° C. for 2 min. All the coatings were performed under a red light and the plate was then stored in a light tight box.

| OC-2 | |
|---|---|
| Component | Weight (g) |
| Airvol 203 (polyvinyl alcohol from Air Products) | 4.84 |
| Silwet 7604 (Surfactant from Union Carbide) | 0.02 |
| Triton X-100 (Surfactant from www.chemistrystore.com) | 0.14 |
| Water | 95.00 |

The plate was exposed with a violet plate imager equipped with a 60 mw violet laser diode emitting at about 405 nm (MAKO-8 from ECRM) for a dosage of about 90µ/cm². The plate was imaged in an orange light room (with Fuji Yellow FV30 lights from Encapsulite), and was kept in a light tight box before and after imaging.

The laser exposed plate was cut into 3 pieces under red light. The first piece was treated with a 5% citric acid aqueous solution by dipping in the solution for 10 seconds. The second piece was rinsed with water by dipping in water for 5 seconds to remove the overcoat. The third piece was not treated. The treatments were performed under red light.

Each of the treated plates was tested on a wet lithographic press (AB Dick 360) under office (white) fluorescent light. The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. The printed sheets were evaluated for on-press developability of the plate, with the results summarized in Table 1.

TABLE 1

| Treatment of the plate | Background at 20 impressions | Background at 200 impressions | Inking in imaging areas |
|---|---|---|---|
| Dip in a 5% citric acid aqueous solution | Clean | Clean | Good |
| Rinse with water | Toning | Toning | Good |
| No treatment | Inked | Inked | Good |

EXAMPLES 15-20

An electrochemically grained, anodized and polyvinylphosphonic acid treated aluminum substrate was coated with a thermosensitive layer formulation PS-4 with a #6 Meyer rod, followed by drying in an oven at 100° C. for 2 min.

| PS-4 | |
|---|---|
| Component | Weight (g) |
| Neocryl B-728 (Polymer from Zeneca) | 2.50 |
| Ebecryl 220 (Acrylate monomer from UCB Chemicals) | 5.99 |
| Pluronic L43 (Nonionic surfactant from BASF) | 0.40 |
| (4-(2-Hydroxytetradecyl-oxy)phenyl)phenyliodonium hexafluorophosphate | 1.00 |
| PINA KF-1151 (Infrared absorbing polymethine dye from Allied Signal) | 0.10 |
| 2-Butanone | 90.00 |

The thermosensitive layer coated plate was further coated with a water-soluble overcoat OC-2 using a #6 Meyer rod, followed by hot air blow drying and baking in an oven at 100° C. for 2 min.

The coated plate was exposed with an infrared laser imager equipped with laser diodes emitting at about 830 nm (Trendsetter from Creo) at a dosage of about 200 mJ/cm². The exposed areas of the plate showed brown color, with the non-exposed areas remain light green. The exposed plate was cut into 6 pieces for further tests.

The first piece was dipped in a 10% by weight citric acid aqueous solution for 20 seconds. The second piece was dipped in a 10% by weight sodium chloride aqueous solution for 20 seconds. The third piece was dipped in a 0.2% by weight sodium hydroxide aqueous solution for 20 seconds. The fourth piece was dipped in a 10% by weight sodium xylenesulfonate aqueous solution for 20 seconds. The fifth piece was rinsed with water. All the above pieces of plate were dried by hot air blow to remove any excess water. The treatments were performed under yellow light. The sixth piece was not treated. All the above plate pieces were then exposed to an office white fluorescent light (total of 80 watts at about 2 meters) for 2 hours. The appearances of the plate pieces were listed in Table 1.

Each of the treated plates was tested on a wet lithographic press AB Dick 360 (under office white fluorescent light). The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. The printed sheets were evaluated for on-press developability of the plate, with the results summarized in Table 2.

TABLE 2

| Aqueous solution for treating plate | Appearance after laser exposure and treatment | | Performance on AB Dick 360 lithographic press | | |
|---|---|---|---|---|---|
| | Non-exposed areas | Laser exposed areas | Background at 20 impressions | Background at 200 impressions | Inking in imaging areas |
| 10% Citric acid | Light green | Brown | Clean | Clean | Good |
| 10% Sodium chloride | Light green | Brown | Clean | Clean | Good |
| 0.2% Sodium hydroxide | Light green | Light brown | Clean | Clean | Good |
| 10% Sodium xylenesulfonate | Light green | Light brown | Clean | Clean | Good |
| Rinse with water | Light green | Brown | Toning | Toning | Good |
| No treatment | Light green | Brown | Inked | Inked | Good |

EXAMPLE 21

A plate was prepared and imagewise exposed the same as in EXAMPLES 15-20, and then dipped in a 0.2% by weight sodium hydroxide aqueous solution for 20 seconds, followed by hot air blow to dry off excess water. The imagewise non-exposed areas was light green and the imagewise exposed areas was light brown. The treated plate was further exposed with a 1000 watts ultraviolet light for 1 minute on an ultraviolet light exposure device (INSTANT 2 VACUUM PRINTER 24×28, from Berkey Technical Co., New York). The imagewise non-exposed areas became essentially colorless and the imagewise exposed became dark brown.

The plate was further tested on a wet lithographic press AB Dick 360 (under office white fluorescent light). The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. The plate rolled up to clean background, good inking, and 2-98% resolution under 20 impressions, with no wearing observed at 200 impressions.

I claim:
1. A method of lithographically printing images on a receiving medium, comprising in order:
   (a) providing a lithographic plate comprising (i) a substrate, and (ii) a photosensitive layer comprising a polymeric binder, a free radical polymerizable monomer, a free radical initiator, and a sensitizing dye; said photosensitive layer being soluble or dispersible in ink and/or fountain solution and capable of hardening upon exposure to a radiation having a wavelength selected from 200 to 1200 nm;
   (b) imagewise exposing said plate with said radiation to cause hardening of said photosensitive layer in the exposed areas, so as to form hardened areas in the exposed areas and non-hardened areas in the non-exposed areas;
   (c) treating said exposed plate with a treating solution to cause at least one chemical or physical change in the photosensitive layer or on the substrate surface;
   (d) drying said treated plate to remove at least some of the water or solvent from the treating solution, wherein said plate is sufficiently dried so that said dried plate is at least free of wet-looking liquid on the surface;
   (e) developing said dried plate with ink and/or fountain solution on a lithographic press to remove the photosensitive layer in the non-hardened areas; and
   (f) lithographically printing images from said plate to the receiving medium.
2. The method of claim 1 wherein said plate is dried by squeegee rollers, rubber blade, forced air, and/or heat.
3. The method of claim 1 wherein said plate is dried by passing through squeegee rollers followed by forced hot air.
4. The method of claim 1 wherein said treatment in said step (c) causes a chemical change in the photosensitive layer or on the substrate surface.
5. The method of claim 1 wherein said treatment in said step (c) causes a chemical reaction between a solute in the treating solution and a component in the photosensitive layer.
6. The method of claim 1 wherein said treating solution is an aqueous solution.
7. The method of claim 1 wherein said treating solution comprises a water soluble solid compound capable of chemically reacting with a compound in said photosensitive layer.
8. The method of claim 1 wherein said treating solution is capable of making said photosensitive layer more soluble or dispersible in ink and/or fountain solution, and the treated plate is capable of being on-press developed at least 5 impressions faster than the untreated plate.

9. The method of claim 8 wherein said treating solution comprises a water soluble liquid organic compound with a boiling point of at least 150° C. and capable of softening the photosensitive layer.

10. The method of claim 1 wherein said plate further comprises an ink and/or fountain solution soluble or dispersible overcoat.

11. The method of claim 1 wherein said plate further comprises an ink and/or fountain solution soluble or dispersible overcoat, and said overcoat is not removed by the treating solution during the treatment and is removed with ink and/or fountain solution during the on-press development.

* * * * *